(12) United States Patent
Mun et al.

(10) Patent No.: US 11,901,383 B2
(45) Date of Patent: Feb. 13, 2024

(54) TRANSISTOR HAVING INCREASED EFFECTIVE CHANNEL WIDTH

(71) Applicant: OMNIVISION TECHNOLOGIES, INC., Santa Clara, CA (US)

(72) Inventors: Seong Yeol Mun, Santa Clara, CA (US); Young Woo Jung, Campbell, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 0 days.

(21) Appl. No.: 17/727,247

(22) Filed: Apr. 22, 2022

(65) Prior Publication Data

US 2022/0246656 A1 Aug. 4, 2022

Related U.S. Application Data

(63) Continuation of application No. 16/729,163, filed on Dec. 27, 2019, now Pat. No. 11,348,957.

(51) Int. Cl.
| | |
|---|---|
| *H01L 27/146* | (2006.01) |
| *H01L 29/786* | (2006.01) |
| *H01L 21/8238* | (2006.01) |
| *H01L 29/423* | (2006.01) |
| *H01L 21/8234* | (2006.01) |

(52) U.S. Cl.
CPC .... *H01L 27/14616* (2013.01); *H01L 27/1463* (2013.01); *H01L 27/14614* (2013.01); *H01L 27/14636* (2013.01); *H01L 27/14643* (2013.01); *H01L 27/14683* (2013.01); *H01L 21/823412* (2013.01); *H01L 21/823807* (2013.01); *H01L 29/4236* (2013.01); *H01L 29/78642* (2013.01)

(58) Field of Classification Search
CPC ......... H01L 27/14614; H01L 27/14616; H01L 27/0826; H01L 29/4236; H01L 29/78642; H01L 21/823412; H01L 21/823807
See application file for complete search history.

(56) References Cited

U.S. PATENT DOCUMENTS

| | | |
|---|---|---|
| 6,476,444 B1 | 11/2002 | Min |
| 7,586,150 B2 | 9/2009 | Jang et al. |
| 7,675,112 B2 | 3/2010 | Lee |
| 7,804,130 B1 | 9/2010 | Fung |

(Continued)

FOREIGN PATENT DOCUMENTS

| | | |
|---|---|---|
| TW | I431767 B | 3/2014 |
| WO | 2021/015009 A1 | 1/2021 |

*Primary Examiner* — David A Zarneke
(74) *Attorney, Agent, or Firm* — Christensen O'Connor Johnson Kindness PLLC

(57) ABSTRACT

Methods of forming transistors include providing a substrate material, forming a recess to a first depth in the substrate material, the recess corresponding to a gate region and extending in a channel length direction and a channel width direction that is perpendicular to the channel length direction, forming a trench structure in the substrate material by deepening the recess to a second depth using an isotropic process, forming an isolation layer on the substrate material, forming a gate portion of the isolation layer on the substrate material such that the gate portion of the isolation layer extends into the trench structure, and forming a gate on the isolation layer such that the gate extends into the trench structure.

19 Claims, 11 Drawing Sheets

(56) References Cited

U.S. PATENT DOCUMENTS

| | | | |
|---|---|---|---|
| 7,932,555 B2 * | 4/2011 | Lee | H10B 12/0387 |
| | | | 257/330 |
| 8,294,159 B2 | 10/2012 | Or-Bach et al. | |
| 8,865,549 B2 | 10/2014 | Lim et al. | |
| 9,117,759 B2 * | 8/2015 | Sapra | H01L 29/04 |
| 9,564,435 B2 * | 2/2017 | Chung | H01L 27/0886 |
| 9,991,299 B2 | 6/2018 | Park et al. | |
| 10,566,361 B2 * | 2/2020 | Wei | H01L 29/0653 |
| 11,164,974 B2 * | 11/2021 | Rachmady | B82Y 10/00 |
| 2008/0012067 A1 | 1/2008 | Wu | |
| 2009/0020798 A1 | 1/2009 | Lee et al. | |
| 2012/0211825 A1 | 8/2012 | Henson et al. | |
| 2015/0155328 A1 | 6/2015 | Park et al. | |
| 2017/0104021 A1 | 4/2017 | Park et al. | |

* cited by examiner

TRANSISTOR HAVING INCREASED EFFECTIVE CHANNEL WIDTH

CROSS-REFERENCE TO RELATED APPLICATION

This application is a continuation of U.S. patent application Ser. No. 16/729,163, filed Dec. 27, 2019, the disclosure of which is hereby incorporated by reference in its entirety.

BACKGROUND

This disclosure relates generally to image sensors, and in particular but not exclusively, source followers and reset transistors for image sensors, and methods of manufacturing source follower transistors and row select transistors for image sensors.

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices. These trends have also contributed to increasing pixel counts.

In image sensors, as the pixel count increases, the bitline setting time also increases due to higher bitline loading. To maintain a high frame rate operation, the transconductance (Gm) of the image sensor source follower transistor can be increased by shortening a length of the source follower channel and/or by increasing a width of the source follower channel. Similarly, the transconductance (Gm) of the image sensor row select transistor can be increased by shortening a length of the row select channel and/or by increasing a width of the row select channel. However, shortening the source follower channel length and/or the row select channel length can lead to deleterious effects, for example short channel effects and undesirable noise, e.g., Random Telegraph Signal (RTS). Widening the source follower channel width and/or the row select channel width can lead to undesirable increases in pixel size.

BRIEF DESCRIPTION OF THE SEVERAL VIEWS OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION

The present disclosure is directed to transistors for image sensors, for example source follower transistors and row select transistors. To facilitate understanding, the present disclosure describes such transistors in the context of complementary metal-oxide-semiconductor ("CMOS") image sensors. However, it shall be appreciated that the invention shall not be limited to transistors for CMOS image sensors, but may be applied to non-CMOS image sensors. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "an embodiment" or "some embodiments" means that a particular feature, structure, or characteristic described in connection with the embodiment is included in at least one embodiment of the present invention. Thus, the appearances of the phrases "in some embodiments" or "in an embodiment" in various places throughout this specification are not necessarily all referring to the same example. Furthermore, the particular features, structures, or characteristics of embodiments may be combined in any suitable manner in one or more examples.

In the present disclosure, the terms "semiconductor substrate" or "substrate" refer to any type of substrate used for forming semiconductor devices thereon, including single crystal substrates, semiconductor on insulator (SOI) substrates, doped silicon bulk substrate, and epitaxial film on semiconductor (EPI) substrates and the like. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

This disclosure refers to a number of terms with respect to different embodiments (including apparatuses and methods). Terms having alike names have alike meanings with respect to different embodiments, except where expressly noted. Similarly, this disclosure utilizes a number of terms of art. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
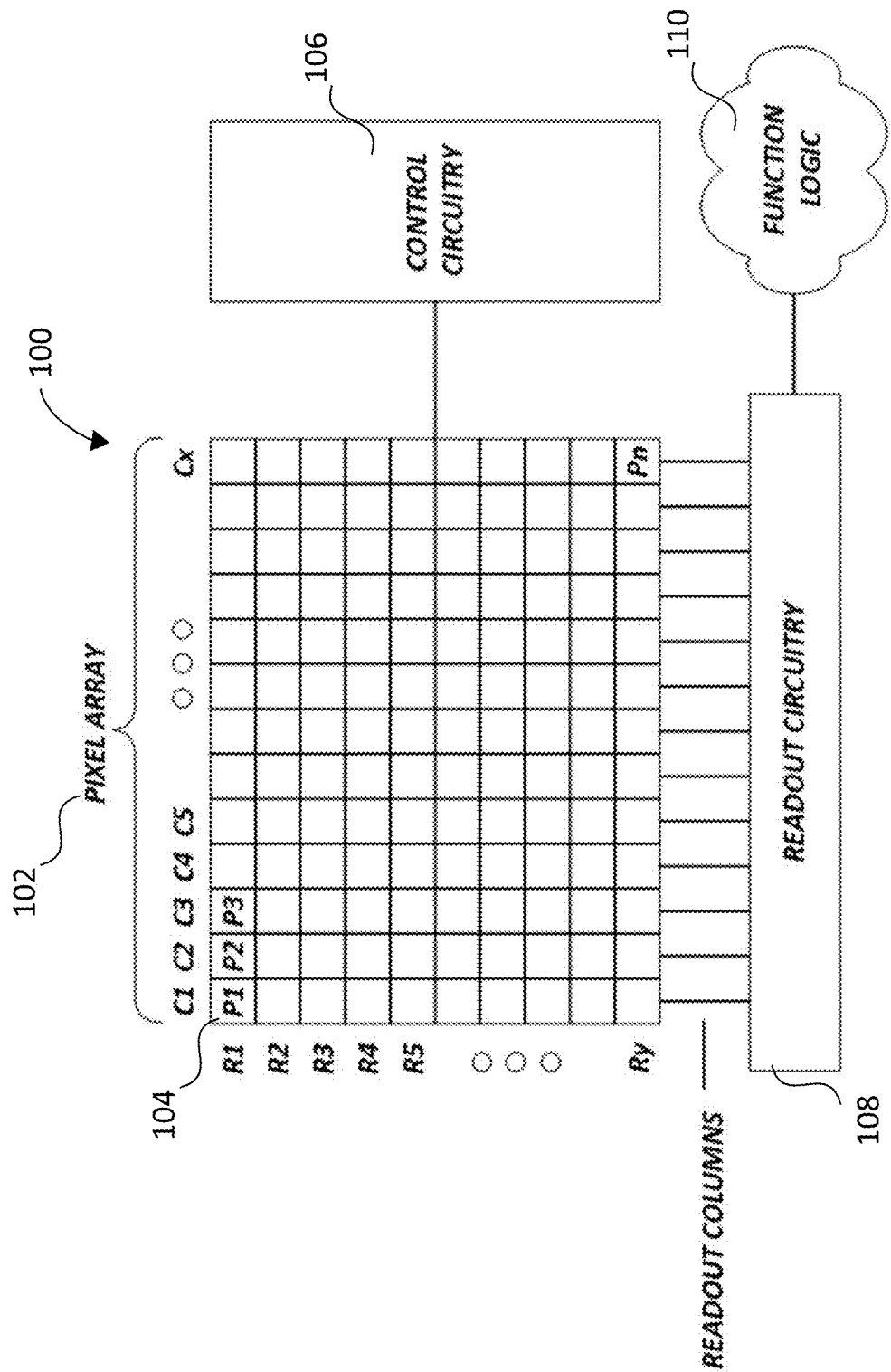
FIG. 1 is a diagram illustrating a representative image sensor having a pixel array.

FIG. 1 is a diagram illustrating one example of a representative image sensor 100 with a pixel array 102 of pixels 104. As shown, the pixel array 102 is coupled to a control circuitry 106 and to a readout circuitry 108, which is coupled to a function logic 110.

Pixel array 102 is a two-dimensional ("2D") array of pixels 104 (e.g., pixels P1, P2 . . . , Pn). In one embodiment, each pixel 104 is a complementary metal-oxide-semiconductor ("CMOS") imaging pixel. Pixel array 102 may be implemented as either a front side illuminated image sensor array, or a backside illuminated image sensor array. In some embodiments, pixels 104 include one or more transistors as depicted below. As illustrated, the pixels 104 are arranged into rows (e.g., rows R1 to Ry) and columns (e.g., column C1 to Cx) to acquire image data of a person, place, or object, which can then be used to render a 2D image of the person, place, or object.

In some embodiments, after a pixel 104 has acquired its image data or image charge, the image data is readout by readout circuitry 108 and transferred to function logic 110. Readout circuitry 108 may include amplification circuitry, e.g., a differential amplifier circuitry, analog-to-digital ("ADC") conversion circuitry, or otherwise. In some embodiments, the readout circuitry 108 may readout a row of image data at a time along readout column lines (illustrated) or may readout the image data using a variety of other techniques (not illustrated), such as a serial readout or a full parallel readout of all pixels simultaneously.

Function logic 110 includes logic and memory for storing the image data or even manipulating the image data by applying post image effects (e.g., crop, rotate, remove red eye, adjust brightness, adjust contrast, or otherwise).

Control circuitry 106 is coupled to pixels 104, and includes logic and memory for controlling operational characteristics of pixels 104. For example, control circuitry 106 may generate a shutter signal for controlling image acquisition. In some embodiments, the shutter signal is a global shutter signal for simultaneously enabling all pixels 104 to simultaneously capture their respective image data during a single acquisition window. In some embodiments, the shutter signal is a rolling shutter signal whereby each row, column, or group of pixels 104 is sequentially enabled during consecutive acquisition windows.

Figure 2:
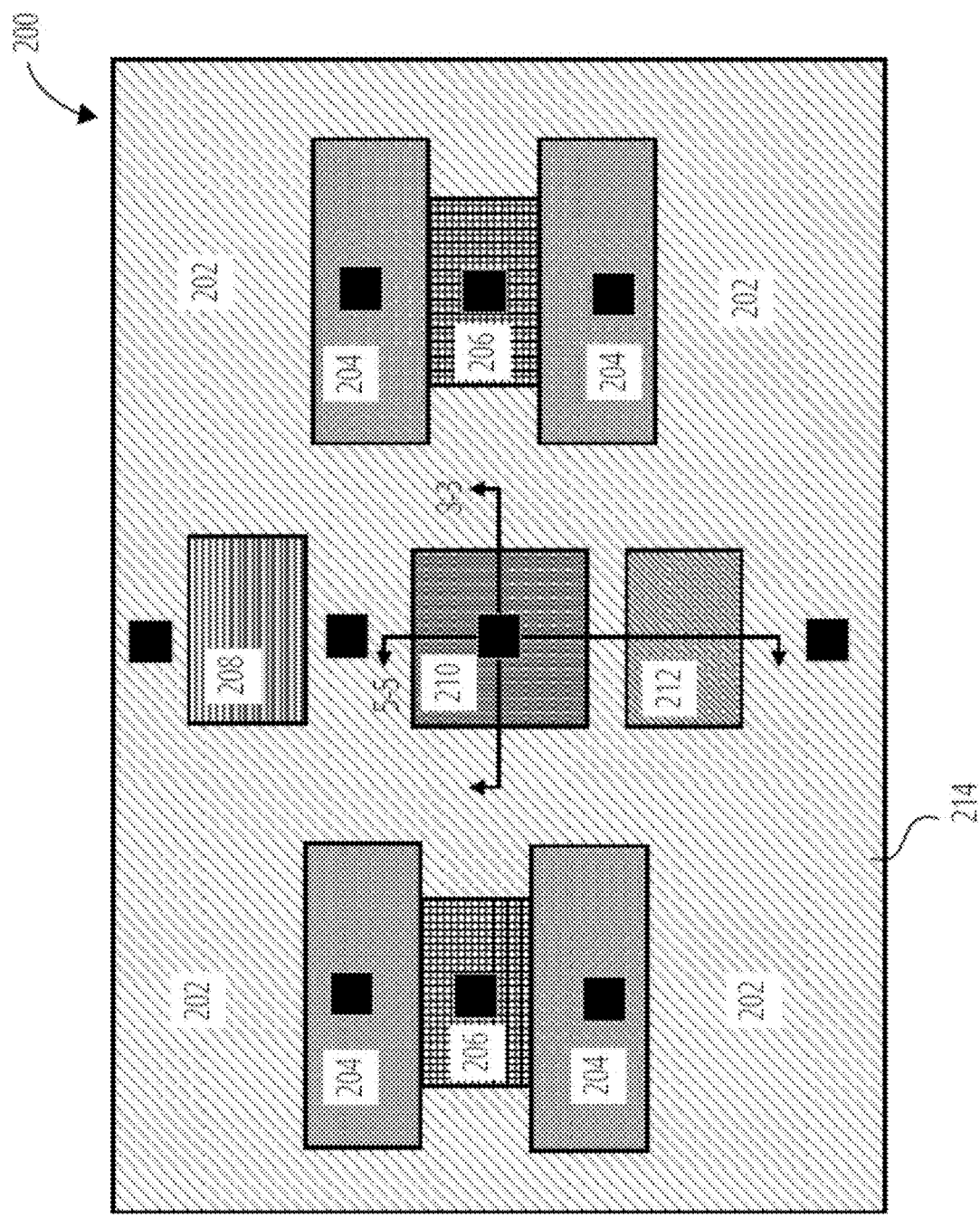
FIG. 2 illustrates an example pixel in accordance with the teachings of the present disclosure.

FIG. 2 schematically shows one example of a representative pixel 200, formed in accordance with the teachings of the present disclosure. The pixel 200 may be utilized in an image sensor such as the image sensor 100 of FIG. 1. The pixel 200 has a plurality of photodiodes 202, a plurality of transfer gates 204 (transfer transistors) that transfer charge from the photodiodes 202 to one of a plurality of floating diffusions 206, a reset transistor 208, a source follower transistor 210, and a row select transistor 212.

Each of photodiodes 202 is configured to generate and accumulate charges in response to incoming light received during an integration period of the image sensor. Charges, e.g., photoelectrons, accumulated in a charge accumulation region of photodiode 202 (e.g., source of transfer transistor), for example during the integration period of image sensor, can be selectively transferred to associated floating diffusion 206 (e.g., drain of transfer transistor) depending on voltage applied to transfer gate 204 of the respective transfer transistor. In some embodiments, the photodiode 202 has a pinned photodiode configuration.

The reset transistor 208 is coupled between a power line and the floating diffusion 202, and is configured to reset (e.g., discharge or charge coupled floating diffusion 206 to a preset voltage e.g., a supply voltage $V_{DD}$) under control of a reset signal received at the reset gate during a reset period. In embodiments, the reset transistor 208 is further coupled to respective photodiodes 202 through the corresponding transfer transistor to selective reset respective photodiodes 202 to the preset voltage during the reset period. Floating diffusion 206 is coupled to a source follower gate of the source follower transistor 210. The source follower transistor 210 is coupled between the power line and the row select transistor 212. The source follower transistor 210 operates to modulate the image signal output based on the voltage of floating diffusion 206 received, where the image signal corresponds to the amount photoelectrons accumulated in charge accumulation region of coupled photodiodes during the integration period at the gate thereof. The row select transistor 212 selectively couples the output (e.g., image signal) of the source follower transistor 210 to the readout column line under control of a row select signal.

In operation, during the integration period (also referred to as an exposure or accumulation period) of the image sensor, photodiodes 202 absorb incident light on respective charge accumulation regions. The photogenerated charge accumulated in the charge accumulation region of a photodiode 202 is indicative of the amount of incident light on charge accumulated. After the integration period, the transfer transistors transfer the photogenerated charge from coupled photodiode 202 to respective floating diffusion 206 upon reception of a transfer signal (e.g., a positive biasing voltage) at transfer gate 204. The source follower transistor 210 generates the image signal based on voltage outputted by the coupled floating diffusion 206. The row select transistor 212 coupled to the source follower transistor 210 then selectively reads out the signal onto a column bit line for subsequent image processing.

In some embodiments, the pixel 200 includes additional elements that are not described in detail herein, such as one or more additional photodiodes, transistors, floating diffusions, etc. The present disclosure generally relates to source follower transistors and row select transistors, such as source follower transistor 210 and row select transistor 212, respectively. For example, the present disclosure provides source follower transistors and row select transistors, each having a high effective channel width. However, the skilled artisan will appreciate that the present disclosure is not limited to source follower transistors and row select transistors. Rather, the teachings of the present disclosure, for example a trench structure having a polygonal cross section as described below, can be utilized to increase an effective channel width of other transistors, for example transistors where higher transconductance is desirable but larger pixel size is undesirable.

Figure 3:
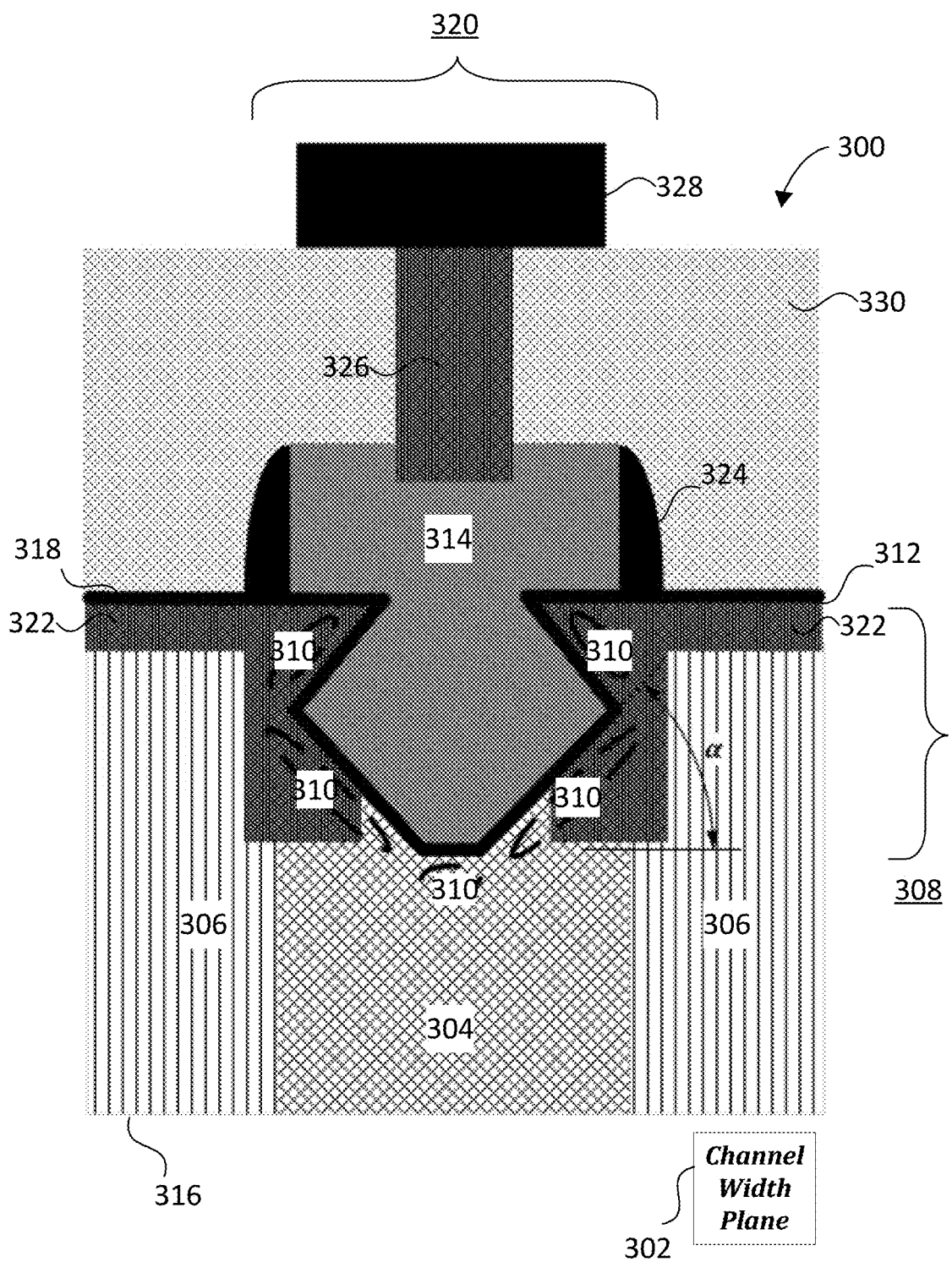
FIG. 3 illustrates an example cross section view, taken in a channel width plane, of a representative transistor in accordance with the teachings of the present disclosure.

FIG. 3 shows a cross section of one representative example of a transistor 300 formed according to the present disclosure. In some embodiments, the transistor 300 is a source follower transistor, a row select transistor, or another transistor. Image sensors (e.g., the image sensor 100 of FIG. 1) and/or pixels (e.g., the pixel 200 of FIG. 2) may include one or more of the transistors 300, for example a source follower transistor and a row select transistor formed as part of a common circuit, one or both transistors being formed in accordance with the structures and methods described below. In such embodiments having more than one transistor formed in accordance with the present disclosure, one or more characteristics of one transistor (e.g., a polygonal cross section, a sidewall dimension, and the like) may differ from a corresponding characteristic of another transistor.

To orient the reader, FIG. 3 shows a cross section of an electron channel through which electrons flow between a source and a drain (e.g., into/out of the page). The section cut of FIG. 3 is taken perpendicular to the direction of current flow, i.e., in a channel width plane 302. By comparison, a channel length plane is oriented into/out of the page, i.e., perpendicular to the channel width plane 302.

The transistor 300 is formed in a substrate material 304, and is operatively coupled to plurality of photodiodes 306 which are also formed in the substrate material 304. The transistor 300 includes a trench structure 308 (in this embodiment, a diamond-shaped trench structure) formed in the substrate material 304 and having a polygonal cross section in the channel width plane 302. The polygonal cross section defines numerous sidewall portions 310 of the substrate material 304. An isolation layer 312 is disposed on the substrate material 304 such that it extends into the trench structure 308 and is disposed adjacent to each sidewall portion 310. A gate 314 is disposed on the isolation layer 312 and also extends into the trench structure 308. In some embodiments, isolation layer 312 is referred as a gate oxide layer. As described in detail below, the electron channel of this transistor passes through the sidewall portions 310 such that the effective channel width is increased relative to a planar channel width 320.

Figure 5:
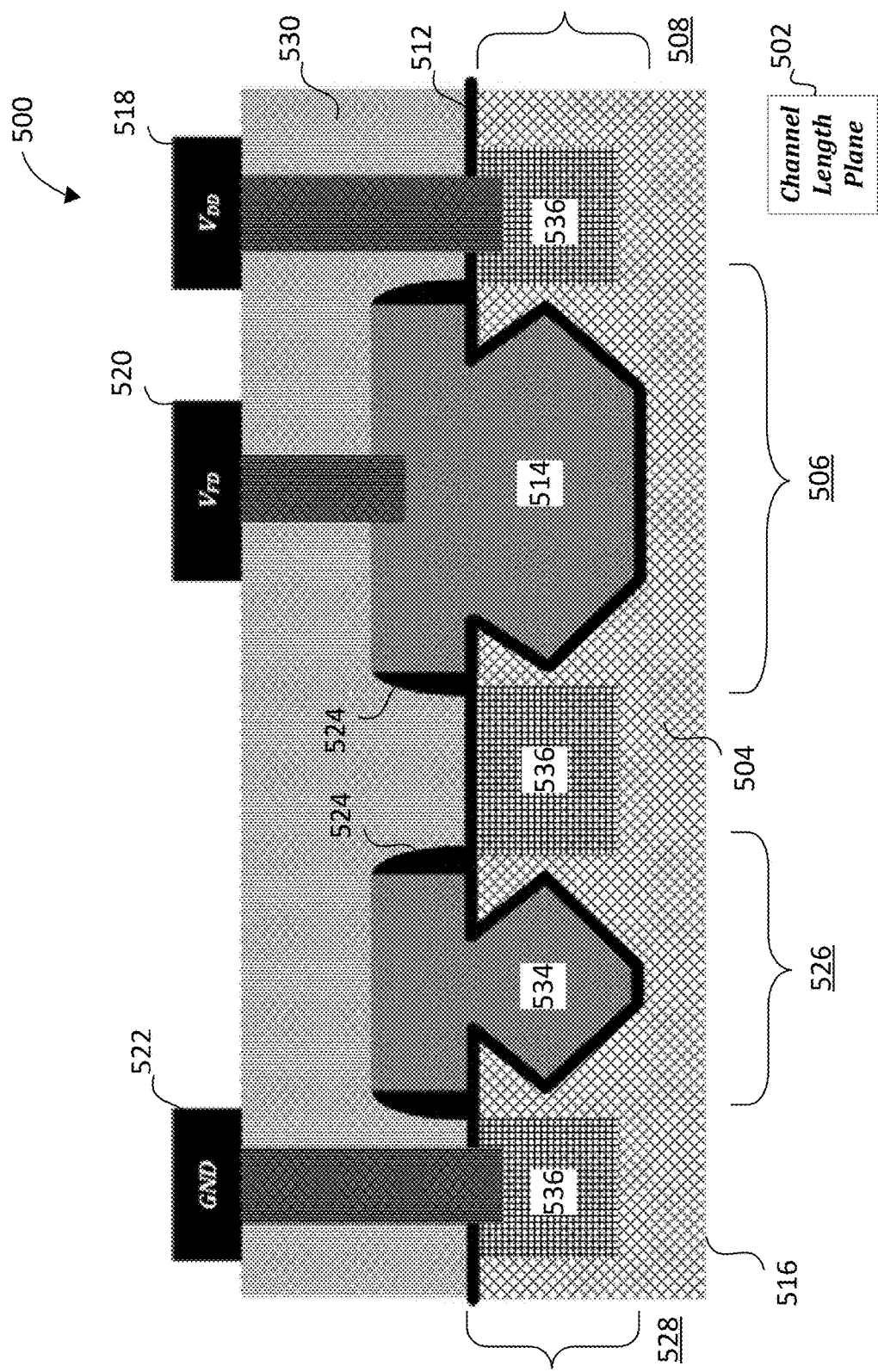
FIG. 5 illustrates an example cross section view, taken in a channel length plane, of a portion of a representative circuit having a plurality of transistors formed in accordance with the teachings of the present disclosure.

Before further describing the inventive structures and methods, it is helpful to clarify relevant terminology. Several measurements of electron channels are discussed in this disclosure: a planar channel width, an effective channel width, and a channel length. Referring still to FIG. 3, planar channel width 320 generally corresponds to a linear width of gate 314, as measured in the channel width plane 302. By comparison, "effective channel width" generally refers a non-linear measurement taken in channel width plane 302 that corresponds to portions of the substrate material 304 through which current flows. For example, transistor 300 is configured such that current flows through each the sidewall portions 310 of the substrate material 304 adjacent to the trench structure 308. Accordingly, the effective channel width of the transistor 300 is at least the sum of the sidewall dimensions (e.g., the longest sidewall dimensions) of the individual sidewall portions 310 measured in the channel width plane 302. The transistors 300 of the present disclosure generally have an effective channel width that exceeds the planar channel width. As another comparison, the "channel length" generally corresponds to a linear length of the gate 314, as measured in a channel length plane that is perpendicular to the channel width plane 302 (e.g., as shown in FIG. 5).

Referring still to FIG. 3, substrate material 304 is a semiconductor substrate, such as silicon substrate, a doped silicon substrate, such as n-type doped silicon substrate or p-type doped substrate, a silicon on insulator substrate, or the like. In FIG. 3, a P-type well portion of substrate material 304 is shown. Substrate material 304 has a back side 316 and an opposite front side 318. In FIG. 3, transistor 300 is part of an image sensor (e.g., the image sensor 100 of FIG. 1) and photodiodes 306 are configured to receive incident light through the back side 316, and therefore the back side 316 may be referred as an illuminated side, and the front side 318 may be referred to as a non-illuminated side.

Photodiodes 306 convert incident light into electrical charge. As used herein, each photodiode 306 is formed in the substrate material 304, for example by ion implantation on the front side 318. In some embodiments, photodiodes 306 are n-type photodiodes formed in a p-type silicon substrate material 304. In some embodiments, the polarity may be reversed; for example, photodiodes 306 are p-type photodiodes formed in an n-type silicon substrate material 304. Some embodiments include a single photodiode 306 rather than a plurality. In some embodiments having a plurality of photodiodes 306, at least two photodiodes 306 have different full well capacities, pixel sizes, and/or light exposure areas.

Trench structure 308 is formed in the substrate material 304, and has characteristics that advantageously increase the effective channel width of the electron channel of the transistor 300 without unduly increasing the planar channel width 320. For example, in FIG. 3, trench structure 308 has a diamond-shaped polygonal cross section in the channel width plane 302, which creates a number of sidewall portions 310 in the substrate material 304. In some embodiments such as FIG. 3, the polygonal cross section forms at least four sidewall portions 310 or at least five sidewall portions 310. In FIG. 3, the polygonal cross section cross section has a 5-sided diamond-like shape, such that a number of the sidewall portions 310 are each diagonal relative to the back side 316 or to the front side 318 of the substrate material 304. In addition to the diagonal sidewall portions 310, the trench structure 308 also forms a bottom sidewall portion 310 that is approximately parallel to the back side 316 or the front side 318. In some embodiments, the diagonal sidewall portions 310 and the bottom sidewall portion 310 are a result of an isotropic process (e.g., a wet etching process) that is utilized to form at least part of the trench structure 308. For example, in some embodiments, one or more of the sidewall portions 310 (e.g., two or more of the sidewall portions 310) form an angle α of between about 40 degrees to about 60 degrees (e.g., about 54 degrees) relative to the back side 316 or the front side 318 of the substrate material 304. Although the trench structure 308 of FIG. 3 has a 5-sided diamond-like shape, in some embodiments, the trench structure 308 has a different polygonal cross section, for example a 4-sided diamond shape without the bottom sidewall portion 310 of FIG. 3, an inverted trapezoidal shape, or a triangular shape. In FIG. 3, each sidewall portion 310 is linear; however, in some embodiments, one or more sidewall portions 310 are not linear.

Figure 4:
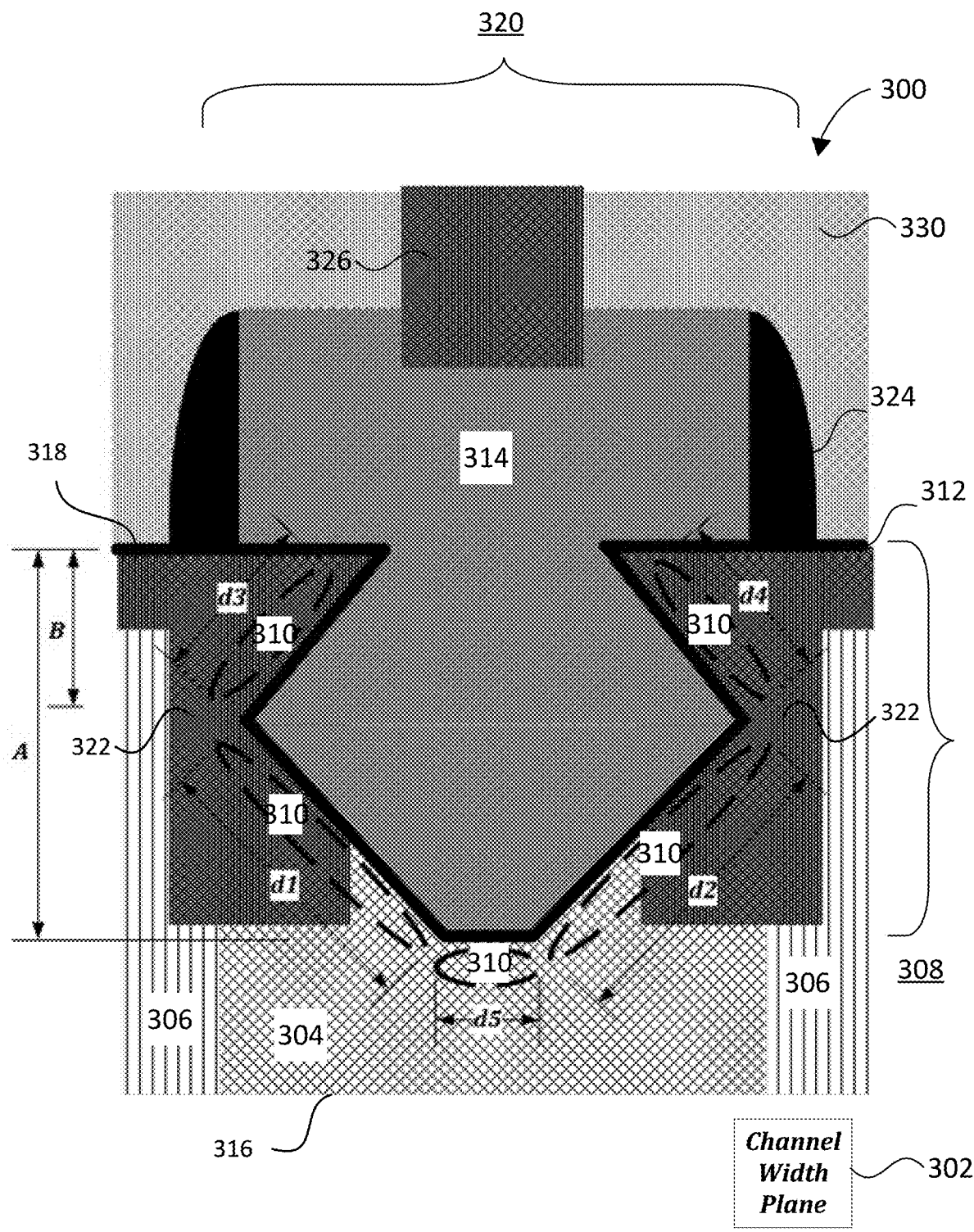
FIG. 4 illustrates a partial cross section view of the representative transistor of FIG. 3.

Referring to FIG. 4, each sidewall portion 310 has a sidewall dimension in the channel width plane 302, e.g., d1, d2, d3, d4, and d5. The sidewall dimension of each sidewall portion 310 may be the longest dimension of that sidewall portion in the channel width plane 302, which may correspond to a length of the sidewall portion 310 measured in the channel width plane 302. As described below, the effective channel width of the electron channel is a function of the individual sidewall dimensions. Generally, increased sidewall dimensions contribute to an increased effective channel width, all else equal. In some embodiments such as FIG. 4, d1 is about equal to d2, and d3 is about equal to d4. In some embodiments, d1, d2, d3, and d4 are about equal. In some embodiments, d1, d2, d3, d4, and d5 are all different. In some embodiments, d1 and d4 are equal to about 0.100 um to about 0.200 um, e.g., about 0.150 um. In some embodiments, d3 and d4 are equal to about 0.050 um to about 0.100 um, e.g., about 0.070 um. In some embodiments, d5 is equal to about 0.030 um to about 0.050 um, e.g., about 0.040 um.

Referring still to FIG. 4, trench structure 308 extends into the substrate material 304 to a first depth A. In some embodiments, the first depth A is about 0.150 um to about 0.200 um, e.g., about 0.180 um. In embodiments having a diamond-shaped polygonal cross section such as in FIG. 4, the trench structure 308 is also defined by a second depth B, which is the depth at which two adjacent diagonal sidewall portions 310 meet. In some embodiments, second depth B is about 0.030 um to about 0.100 um. In some embodiments, the second depth B corresponds to a depth of a recess formed in the substrate material 304 during a manufacturing method (e.g., by an anisotropic process) prior to forming the trench structure 308.

Referring again to FIG. 3, isolation layer 312 is at least partially formed from a dielectric material, such as an oxide or high-k material, e.g., a material having a dielectric constant that is greater than about 3.9 (e.g., $Al_2O_3$ or $HfO_2$).

In some embodiments, isolation layer 312 has a thickness of about 0.005 um to about 0.10 um, e.g., about 0.01 um to about 0.05 um. In some embodiments, isolation layer 312 is formed from two or more manufacturing steps, but forms a substantially continuous layer.

Gate 314 is disposed on the isolation layer 312 such that it fills the trench structure 308 formed in the substrate material 304. Thus, the gate 314 interfaces with each sidewall portion 310 on an opposite side of the isolation layer 312. Gate 314 is at least partially formed from a conductive material such as a polysilicon, a metal, or other conductive material. In one embodiment, for an N-channel transistor, the gate 314 is formed of N-type doped polysilicon. In one embodiment, for a P-channel transistor, the gate 314 is formed of P-type doped polysilicon Gate 314 includes a planar portion formed adjacent to the front side 318 of the substrate material 304 and a trench portion that extends into the trench structure 308.

Isolation implants 322 are optional doped portions of the substrate material 304 that isolate electron channel from the photodiodes 306. For example, the isolation implants 322 are disposed in the substrate material 304 on opposite sides of the trench structure 308 such that the isolation implants 322 are disposed between the trench structure 308 and the photodiodes 306. Some embodiments have a single isolation implant 322, for example, a transistor 300 that is coupled to a single photodiode 306. The composition of the isolation implants 322 can vary between different embodiments. For example, in a transistor 300 disposed in an n-type substrate material 304 or between n-type photodiodes 306, the isolation implants 322 may each be an isolation implant having same conductive type as the substrate material 304, for example a p-type isolation implant, such as a highly concentrated p-type isolation implant. In some embodiments, in which the transistor 300 is disposed in a n-type substrate material 304, the isolation implants 322 may each be an n-type isolation implant. In some embodiments, isolation implant 322 includes a highly concentrated pinning layer disposed in the substrate material 304 between the isolation layer 312 and the photodiode 306.

Optional spacer 324 is disposed around the gate 314, e.g., in a configuration that improves current and voltage parameters of the transistor 300. In some embodiments, the spacer 324 substantially surrounds the gate 314. In some embodiments, spacer 324 is formed of a dielectric material similar to the isolation layer 312. Spacer 324 may be single layer or multi-layer stack structure formed of oxide, nitride or a combination thereof.

Optional contact plug 326 and contact pad 328 electrically connect the transistor 300 to a voltage source for example through metal interconnection structure. In some embodiments in which transistor 300 is a source follower transistor, the contact plug 326 and contact pad 328 electrically connect the transistor 300 to a floating diffusion (e.g., the floating diffusion 206 of FIG. 2). In some embodiments in which the transistor 300 is a row select transistor, there may not be a contact plug 326 or contact pad 328 connected to the gate 314. Further, at least one optional dielectric layer 330 (e.g., an inter-layer dielectric) further insulates the transistor 300 from surrounding elements of the pixel and image sensor in which it is disposed. Dielectric layer 330 is formed from a dielectric material that is similar to or the same as the dielectric material of the isolation layer 312, for example silicon oxide.

In use, the foregoing structure creates a transistor 300 having an effective channel width that is a function of the sidewall dimensions of the sidewall portions 310 of the polygonal trench structure 308. That is, the effective channel width is at least as great as the sum of the individual sidewall dimensions of the sidewall portions 310. Advantageously, the effective channel width can be wider than the planar channel width 320, which enables greater Gm without greater pixel size. In FIG. 4, the effective channel width is at least as wide as d1+d2+d3+d4+d5, which is wider than the planar channel width 320. In one example of the structure shown in FIG. 3 and FIG. 4, d1=d2=about 0.150 um, d3=d4=about 0.070 um, and d5=about 0.040 um, resulting in an effective channel width of at least about 0.480 um. Given a planar channel width 320 of about 0.200 um, this is a 2.4× increase in effective channel width over the planar channel width, without a corresponding increase in pixel width. In some embodiments in which the trench structure 308 does not have a bottom sidewall portion 310, the effective channel width is at least about d1+d2+d3+d4. In some embodiments such as the transistor 300 of FIG. 3, the electron channel passes through an entirety of each sidewall portion 310. In some embodiments, the electron channel passes through an entirety of some sidewall portions 310, but only a part of other sidewall portions 310. In some embodiments, the electron channel passes through at least part of each sidewall portion 310. In some embodiments, selective implants into substrate material 304 are utilized to achieve these variations.

FIG. 5 shows a cross section of one example of a representative portion of a circuit 500 formed in accordance with the teachings of the present disclosure. Image sensors (e.g., the image sensor 100 of FIG. 1) and/or pixels (e.g., the pixel 200 of FIG. 2) may include the illustrated portion of circuit 500. FIG. 5 shows the circuit 500 along a channel length plane 502, which is perpendicular to a channel width plane (such as the channel width plane 302 of FIG. 3).

The circuit 500 has a first transistor and a second transistor that both have a construction similar to the transistor 300 of FIG. 3. The first transistor and the second transistor are configured to be in electrical communication with each other and with a plurality of voltage sources via a plurality of implants 536 formed in a substrate material 504 (e.g., silicon substrate material). In some embodiments, the first transistor and the second transistor have a common effective channel width. In some embodiments, the first transistor and the second transistor have different effective channel widths.

In some embodiments, the first transistor of FIG. 5 is a source follower transistor 506 and the second transistor is a row select transistor 526 that are both formed in accordance with the teachings of the present disclosure. In some embodiments, the first transistor and/or the second transistor are different transistors, e.g., a reset transistor or another transistor of an image sensor. A positive supply voltage 518, a negative supply voltage 520, and a ground 522 are operatively connected to the circuit 500 via corresponding contact pads and contact plugs. In embodiments having a different selection and/or arrangement of transistors, the circuit 500 may have additional, fewer, and/or different voltage sources. In some embodiments, implants 536 are n-type implants (e.g., highly concentrated n-type implants) formed in a p-type silicon substrate material 504 (e.g., formed in a p-type well of the substrate material 504) to form source and drain regions for the first and the second transistor. In some embodiments, the polarity may be reversed; for example, implants 536 are p-type implants formed in an n-type substrate material 504.

Figure 6:
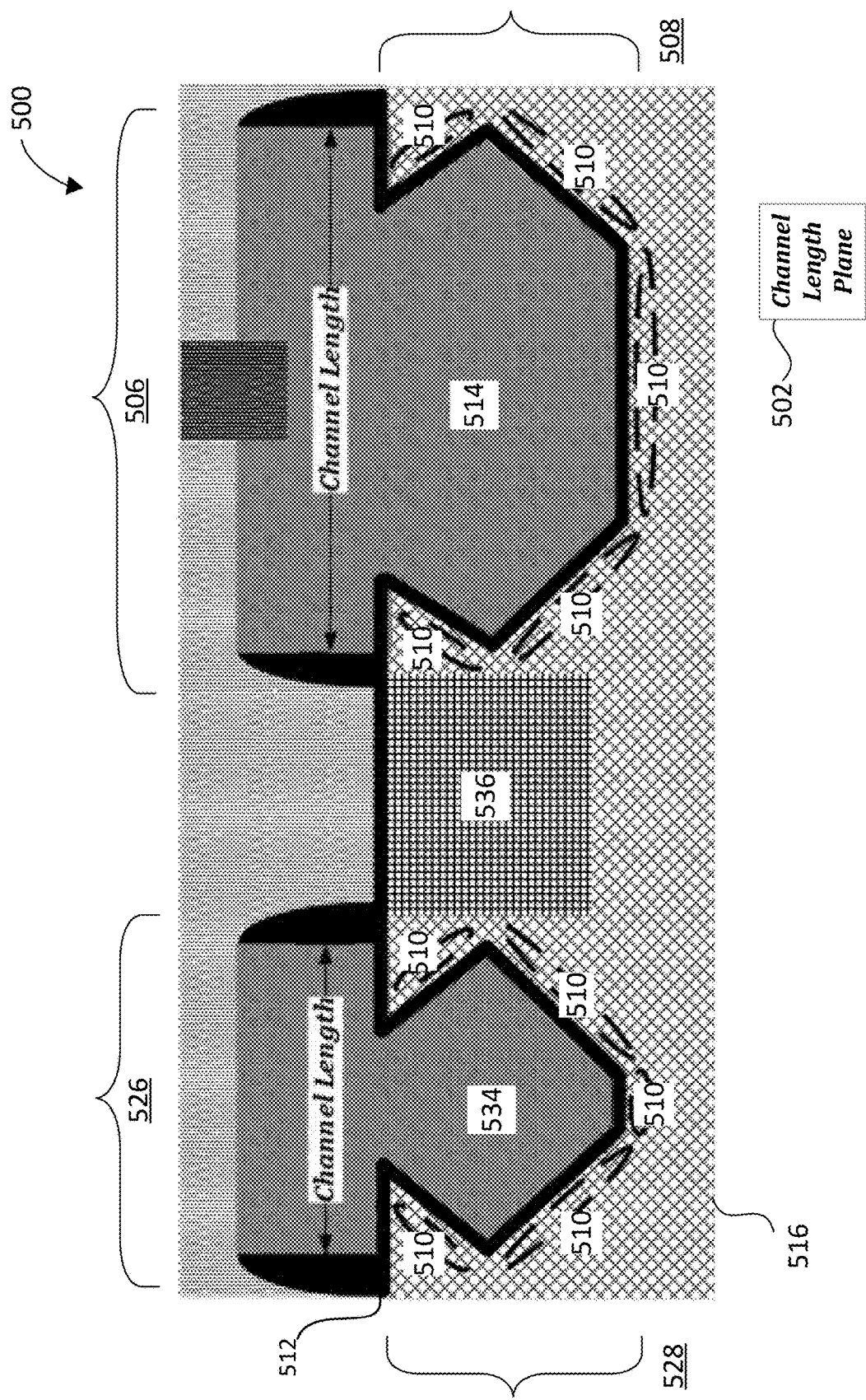
FIG. 6 illustrates a partial cross section view of the representative circuit of FIG. 3.

FIG. 6 shows a cross section of another example of a representative portion of a circuit 500 formed in accordance with the teachings of the present disclosure. Source follower transistor 506 has a construction similar to the transistor 300 of FIG. 3. That is, source follower transistor 506 is formed in the substrate material 504, and is operatively coupled to plurality of photodiodes which are also formed in the substrate material 504 but are not shown in FIG. 5 due to their placement in a different plane. The source follower transistor 506 includes a trench structure 508 formed in the substrate material 504 and having a polygonal cross section in the channel length plane 502, the polygonal cross section defining numerous sidewall portions of the substrate material 504 that are described with respect to FIG. 6. Because the source follower transistor 506 has a construction similar to the transistor 300 of FIG. 3, the trench structure 508 also has a polygonal cross section in the channel width plane, which is not shown in FIG. 5. An isolation layer 512 is disposed on the substrate material 504 such that it extends into the trench structure 508 and is disposed adjacent to each sidewall portion. A gate 514 is disposed on the isolation layer 512 and extends into the trench structure 508. Optional spacer 524 is disposed around the gate 514 to further improve transistor performance.

Row select transistor 526 also has a construction similar to the transistor 300 of FIG. 3, and is formed in substrate material 504 in electrical communication with the source follower transistor 506. In particular, row select transistor 526 includes a trench structure 508 formed in the substrate material 504 and having a polygonal cross section in the channel length plane 502, the polygonal cross section defining numerous sidewall portions of the substrate material 504 that are described with respect to FIG. 6. Because the row select transistor 526 has a construction similar to the transistor 300 of FIG. 3, the trench structure 528 also has a polygonal cross section in the channel width plane, which is not shown in FIG. 5. The isolation layer 512 disposed on the substrate material 504 also extends into the trench structure 528 and is disposed adjacent to each sidewall portion. A gate 534 is disposed on the isolation layer 512 and extends into the trench structure 528. Optional spacer 524 is disposed around the gate 514 to further improve performance.

An optional dielectric layer 530 (e.g., an inter layer dielectric) is disposed over the gate 514 and gate 534 in a configuration that insulates the source follower transistor 506 and row select transistor 526 from surrounding elements of the circuit 500.

As shown in FIG. 5 and FIG. 6, both the trench structure 508 and trench structure 528 have a polygonal cross section in the channel length plane 502. As noted above, both the trench structure 508 and trench structure 528 also have a polygonal cross section in the channel width plane. Similar to the trench structure 308 of FIG. 3, the polygonal cross sections in the channel length plane 502 of the trench structure 508 and trench structure 528 create a number of sidewall portions 510 in the substrate material 504 proximal to the gate 514 and gate 534, respectively. The electron channel of each of source follower transistor 506 and row select transistor 526 passes through these sidewall portions 510.

In FIG. 5 and FIG. 6, trench structure 508 and trench structure 528 have similar polygonal cross sections, but different dimensions. That is, both polygonal cross sections form at least four sidewall portions 510 or at least five sidewall portions 510. Also, both polygonal cross sections have a 5-sided diamond-like shape, each having a number of sidewall portions 510 that are diagonal relative to a back side 516 of the substrate material 504, and a bottom sidewall portion 510 that is approximately parallel to the back side 516. In some embodiments, the trench structure 508 and trench structure 528 have the same polygonal cross sectional shape and the same dimensions. In some embodiments, one or both of the trench structure 508 and trench structure 528 have sidewall portions with different sidewall dimensions or proportions than shown in FIG. 5 and FIG. 6. In some embodiments, the source follower transistor 506 and the row select transistor 526 has a common effective channel width. In some embodiments, the source follower transistor 506 and the row select transistor 526 have different effective channel widths. For example, in some embodiments, the row select transistor 526 has a smaller effective channel width than the source follower transistor 506.

In some embodiments, the diagonal sidewall portions 510 result from an isotropic process (e.g., a wet etching process) that is utilized to form at least part of the trench structure 508 and trench structure 528. In some embodiments, a same isotropic process is utilized to form at least part of the trench structure 508 and trench structure 528. In such embodiments, one or more of the sidewall portions 510 of the trench structure 508 and the trench structure 528 (e.g., two or more sidewall portions of each trench structure 508 and trench structure 528) form a common angle α (e.g., the angle α shown in FIG. 3) of between about 40 degrees to about 60 degrees (e.g., about 54 degrees) relative to the back side 516. In some embodiments, the trench structure 508 and/or trench structure 528 has a different polygonal cross section, for example a 4-sided diamond shape without a bottom sidewall portion 510.

Whereas the sidewall portions 510 contribute to increased effective channel width (as shown in FIG. 3), the channel length of each of the source follower transistor 506 and row select transistor 526 remains unaffected by the polygonal cross sections, because electrons generally move parallel to the channel length plane 502. Accordingly, source follower transistor 506 and row select transistor 526 have a channel length corresponding a planar length of the gate 514 and gate 534, respectively. This combination of characteristics (i.e., increased effective channel width and limited channel length) advantageously contribute to increased Gm, without increasing the likelihood of undesirable short channel effects or RTS.

FIG. 7-FIG. 10 illustrate one example of a representative method of manufacturing a transistor 700 for an image sensor and/or a pixel according to the teachings of the present disclosure. Terms utilized with respect to this representative method and having common names with structural terms used to describe the representative image sensors, pixels, and transistors of FIG. 1-FIG. 6 have common meanings with those terms. In some embodiments, the method of FIG. 7-FIG. 10 is utilized to form a source follower transistor and/or a row select transistor. In some embodiments, each of the steps below is executed in a first instance for a source follower transistor and in a second instance for a row select transistor (either at a same or substantially the same time as the first instance), in order to form both transistors on a common substrate material. Thus, the method of FIG. 7-FIG. 10 may be executed in a first instance for a source follower transistor and, substantially contemporaneously with the first instance, in a second instance for a row select transistor. The representative method may include, or may be modified to include one or more steps to impart one or more properties (e.g., dimensions) to structural elements, in accordance with the description of those elements provided above.

Figure 7:
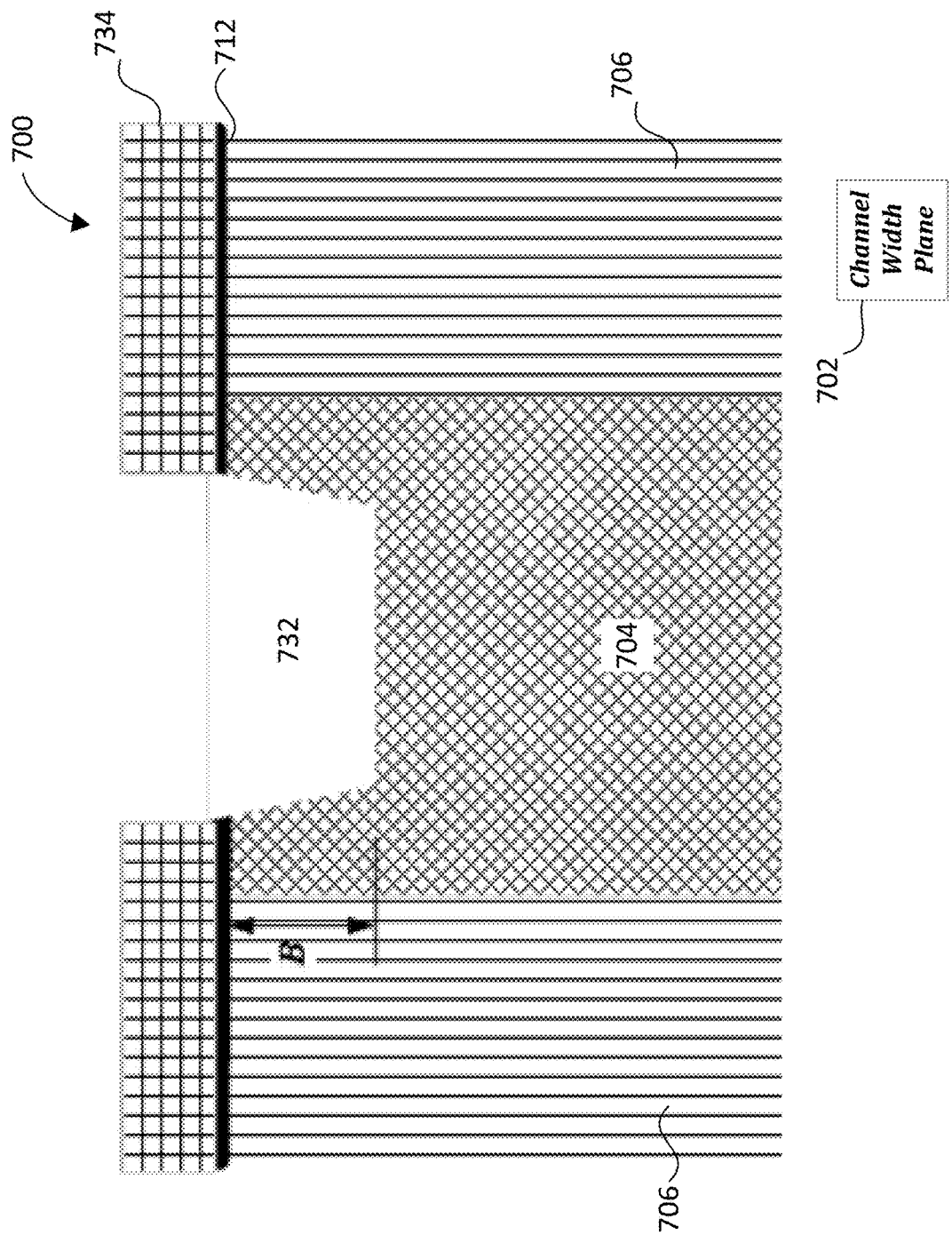
FIG. 7-FIG. 10 illustrate a representative method of manufacturing a representative transistor in accordance with the teachings of the present disclosure.

Referring to FIG. 7 (taken in a channel width plane 702), a substrate material 704 is provided. One or more photodiodes 706 are formed in the substrate material 704, and an isolation layer 712 is formed on the substrate material 704, for example on a front side of the substrate material 704. A recess 732 is formed in the substrate material 704, e.g., to a depth B of about 0.030 um to about 0.100 um. In some embodiments, an anisotropic process (such as a dry etching process) is used to form the recess 732. The recess 732 extends in the channel width plane 702, but also in a channel length direction between a source and a drain. In some embodiments, the method includes using a mask 734 to define a gate region, i.e., the dimensions of the recess 732 in a planar channel width direction and a channel length direction. A lithograph process, or similar, may be utilized to form the mask 734. After forming the recess 732, the mask 734 is removed.

Figure 8:
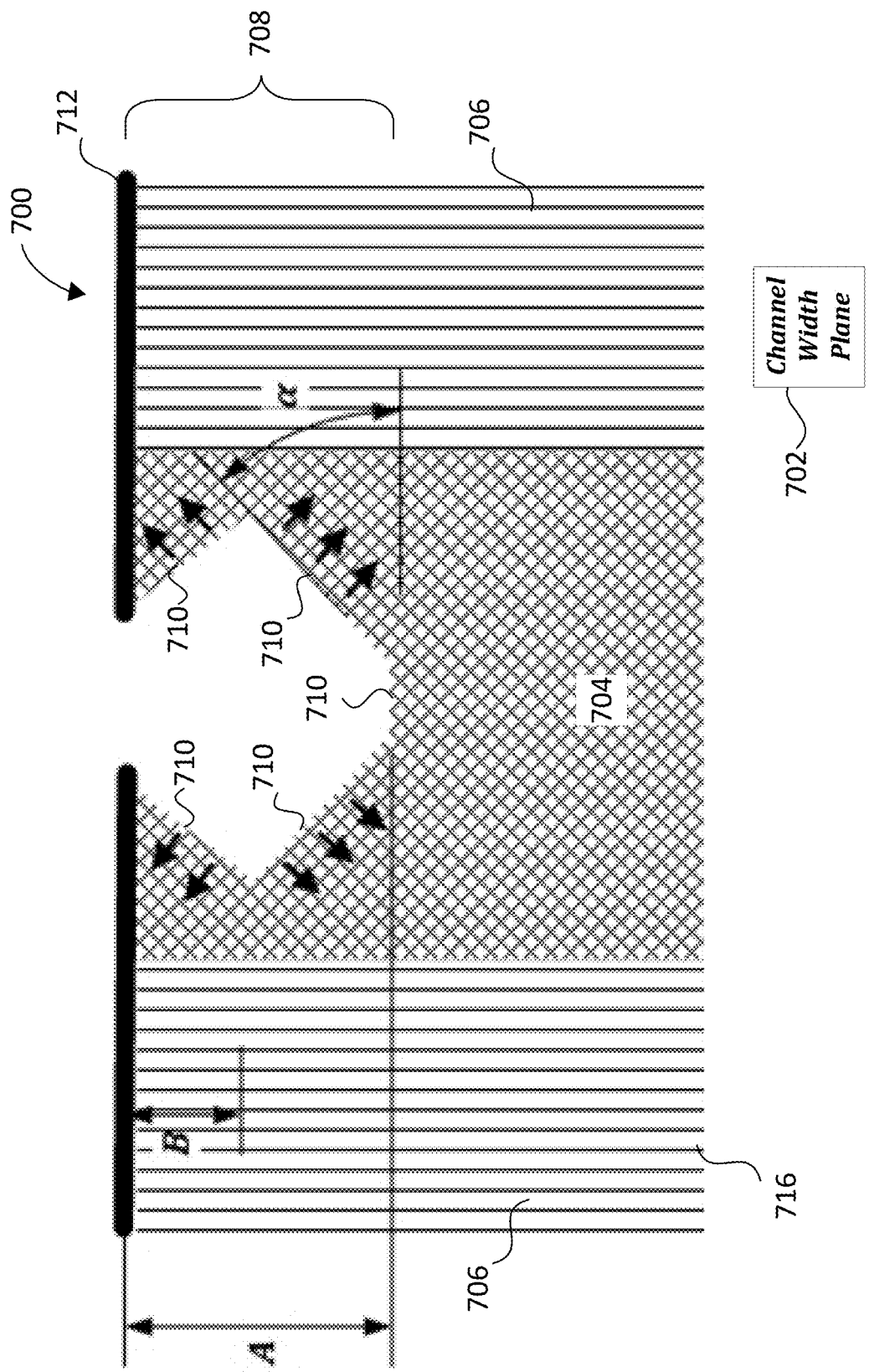

Referring to FIG. 8, a trench structure 708 is formed in the substrate material 704 by deepening the recess 732 from depth B to a depth A using an isotropic process, for example a wet etching process utilizing $NH_4OH$, Tetramethylammonium Hydroxide, or similar etchant. In some embodiments, depth A is about 0.150 um to about 0.200 um. The isotropic process removes material from the substrate material 704 in numerous directions, thereby causing the trench structure 708 to grow larger in the channel width plane 702 such that it forms a polygonal cross section. In some embodiments, the isotropic process removes material from the substrate material 704 at about 40 degrees to about 60 degrees or another angle α relative to a backside surface 716 of the substrate material 704, e.g., 54 degrees. As a result of the isotropic process, the trench structure 708 has a polygonal cross section in the channel width plane 702, e.g., the 5-sided diamond-shape shown in FIG. 8. Further, the isotropic process forms a plurality of sidewall portions 710 in the trench structure 708, which imparts a relatively large effective channel width to the trench structure 708. In some embodiments, the isotropic process is controlled as a function of time, e.g., to achieve a polygonal cross section having desired side sidewall portion dimensions. In some embodiments, the wet etching process includes controlling an etching rate ratio in the channel width plane 702. After forming the trench structure 708, the substrate material 704 can be implanted with one or more implants, for example to insulate the electron channel from the adjacent photodiodes. In some embodiments, the substrate material 704 is implanted with a P-type implant (e.g., a PW implant).

Figure 9:
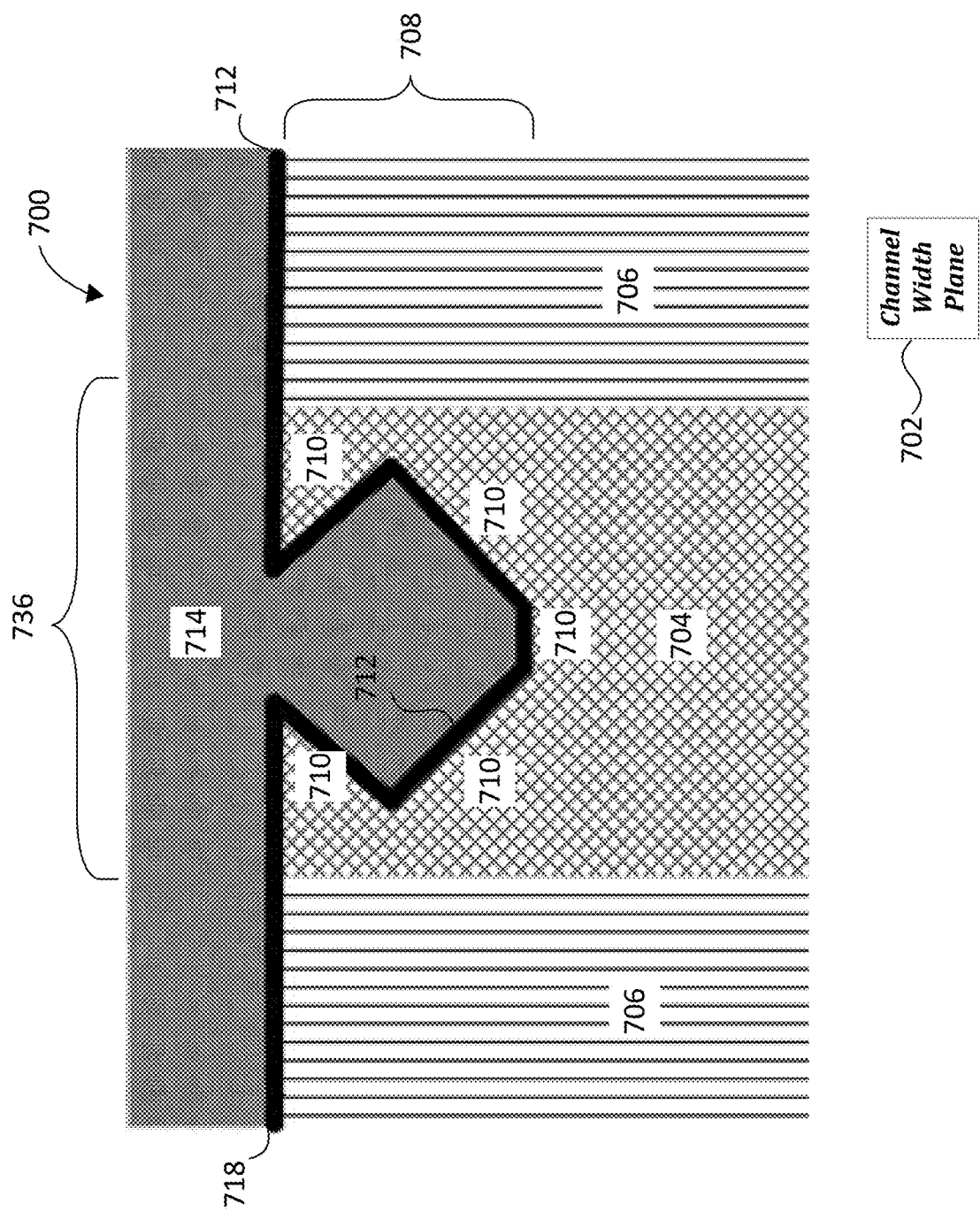

Referring to FIG. 9, after the trench structure 708 is formed, a gate portion of the isolation layer 712 is formed on the substrate material 704 such that it extends into the trench structure 708 and is disposed adjacent to each sidewall portion 710. The gate portion of the isolation layer 712 may be formed of a same or similar material as the isolation layer 712, and forms a continuous isolation layer 712 on the substrate material 704. After forming the isolation layer 712, a gate 714 is formed on the isolation layer 712 by depositing a conductive material (e.g., poly-silicon, a metal, or the like) on the isolation layer 712, filling the trench structure 708 and covering at least a portion of the substrate material 704 corresponding to a gate region 736. The gate 714 includes a planar portion formed on the isolation layer 712 adjacent to a surface of the substrate material 704 and a trench portion that extends into the trench structure 708.

Figure 10:
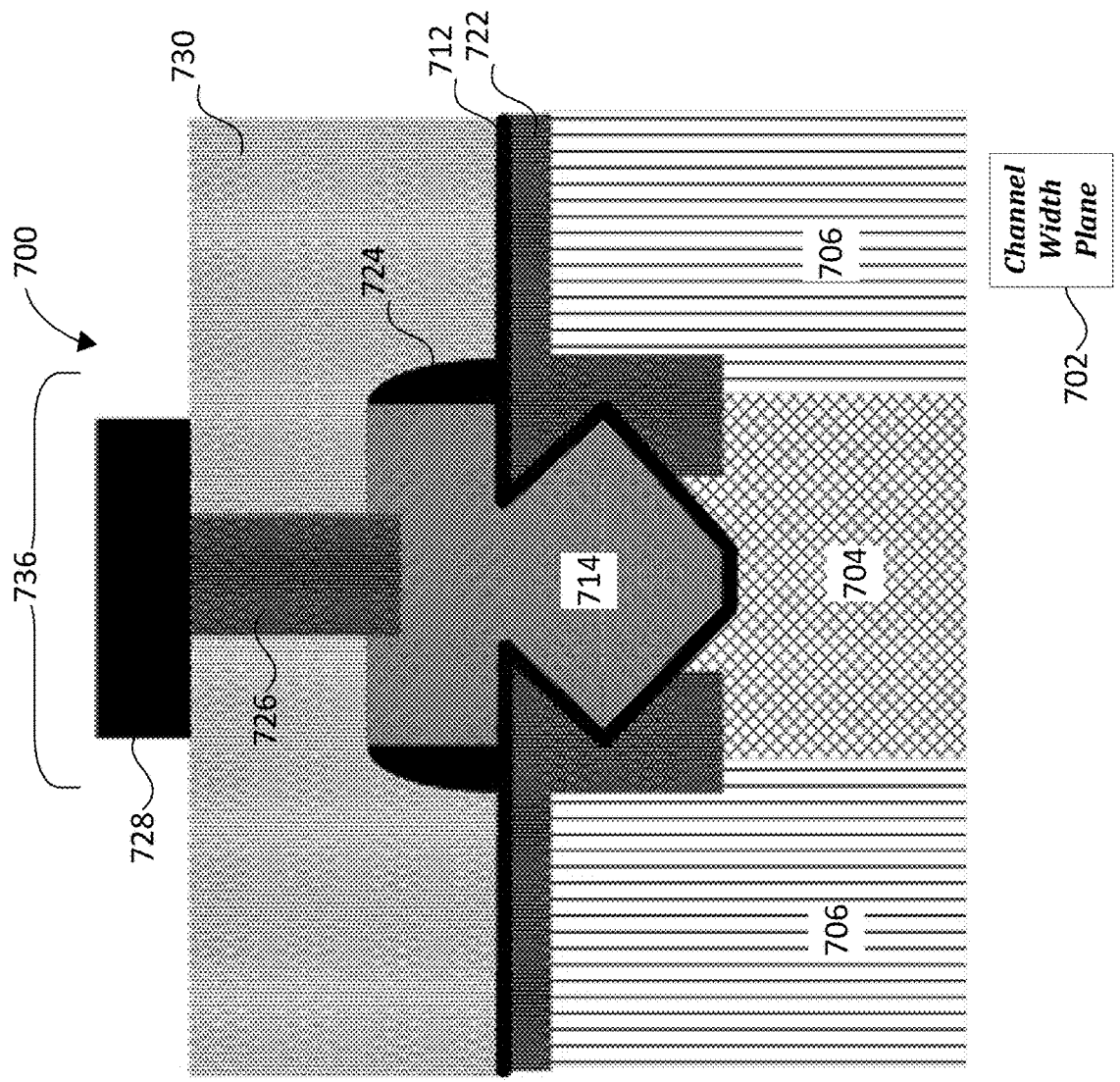

Referring to FIG. 10, the gate 714 is reshaped and resized to its final configuration, e.g., using a lithograph process to remove excess material of the gate 714 such that gate 714 occupies the gate region 736. Optionally, a spacer 724 is formed on opposite sides or around the gate 714 by lithography and dielectric material deposition processes. In some embodiments (e.g., when the transistor 700 is a source follower transistor), a contact plug 726 and a contact pad 728 are formed, e.g., to electrically connect the transistor 700 to a voltage source. Optionally, a dielectric layer 730 such as an inter-layer dielectric is disposed over the gate 714, e.g., in order to insulate the transistor 700 from surrounding elements of the pixel and image sensor in which it is disposed. An optional isolation layer 722 may be formed to isolate the electron channel from other elements of the transistor 700.

Figure 11:
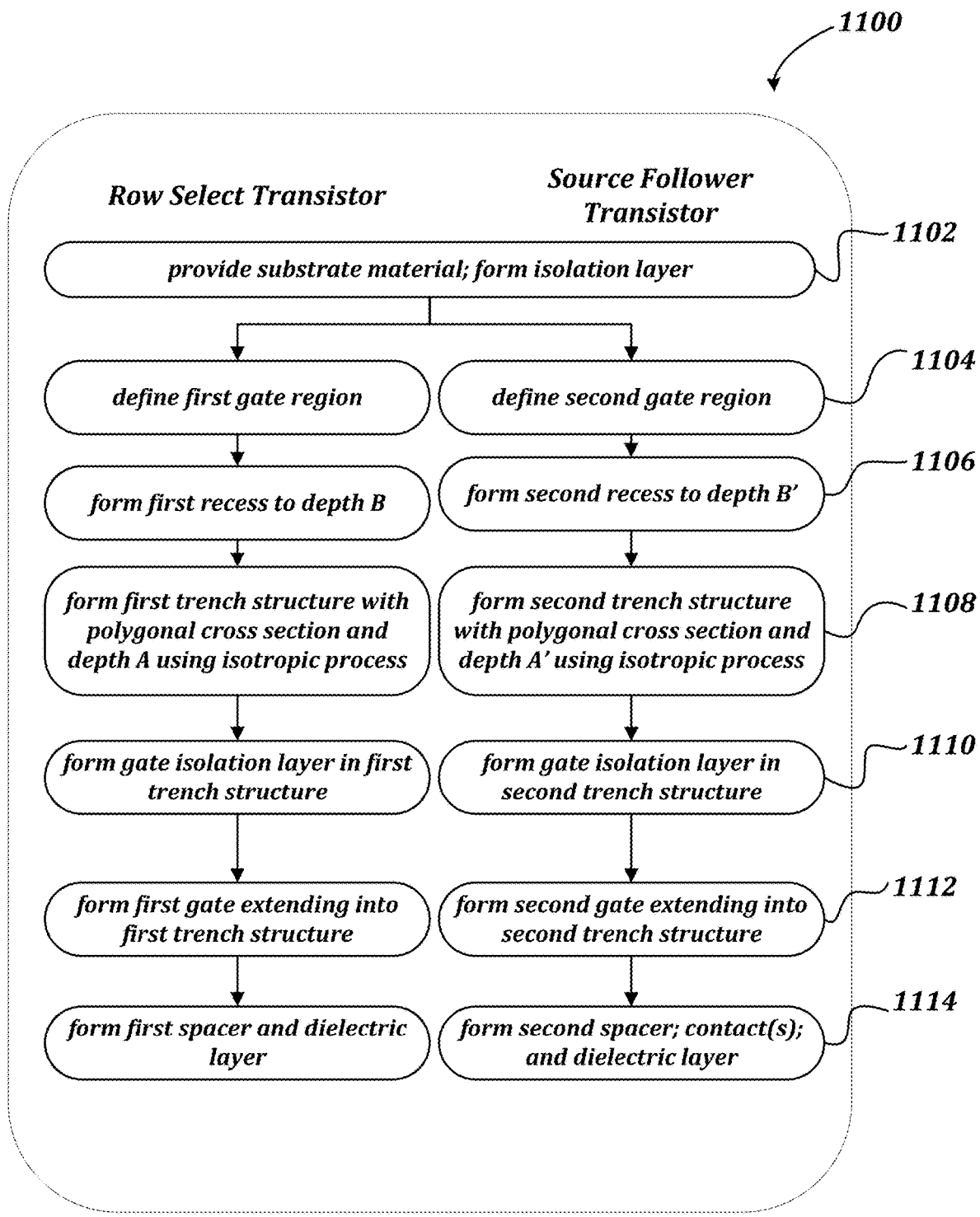
FIG. 11 illustrates a representative flow diagram of a method of manufacturing two representative transistors in accordance with the teachings of the present disclosure.

FIG. 11 is a flow chart of a representative method 1100 that summarizes the method of FIG. 7-FIG. 10 as applied to contemporaneously form a row select transistor and a source follower transistor on a common substrate material. In the illustrated method, a step performed in relation to the row select transistor is performed at substantially contemporaneously with a corresponding step in relation to the source follower transistor (i.e., by the same basic process without significant changes to process steps, methods, etc.). Although the following description refers to a number of discrete steps, the actions described may be performed within a greater or fewer number of steps.

At step 1102, a substrate material common to both a source follower transistor and a row select transistor is provided, and an isolation layer is formed on the substrate material.

At step 1104, a first gate region and a second gate region are defined over the substrate material, corresponding to the row select transistor and the source follower transistor, respectively. A mask formed by a lithograph process (or similar) may be used to define the first and second gate regions, which can have the same or different dimensions.

At step 1106, a first recess is formed in substrate material corresponding to the first gate region, such as with an anisotropic process. The first recess is formed to a first depth B. A second recess is also formed in the substrate material corresponding to the second gate region. The second recess is formed to a first depth B'. The first depths B and B' may be the same or different.

At step 1108, a first trench structure (corresponding to the row select transistor) is formed in the substrate material to a second depth A by deepening the first recess using an isotropic process, such a wet etching process. A second trench structure (corresponding to the source follower transistor) is formed in the substrate material by deepening the second recess to a second depth A'. The second depths A and A' may be the same or different.

At step 1110, a first gate portion of the isolation layer and a second gate portion of the isolation layer are formed such that they extend into the first trench structure and the second trench structure, respectively. The gate portions of the isolation layer form a continuous isolation layer with the previously-formed isolation layer of step 1102.

At step 1112, a first gate is formed in the first trench structure, and a second gate is formed in the second trench structure. Each of the first gate and the second gate have a planar portion formed on the surface of the substrate material 704 and a trench portion that extends into the first trench structure and the second trench structure, respectively.

At optional step 1114, a first spacer is formed on opposite sides or around the first gate. Likewise, an optional second spacer may be formed on opposite sides or around the second gate. In some embodiments, the method includes forming a first spacer, but not a second spacer, or vice versa. In some embodiments, the method does not include forming either the first spacer or the second spacer. In some embodiments, a contact plug and a contact pad (or other contact structure) are formed in relation to the second gate corresponding to the source follower transistor. An optional dielectric layer (e.g., an inter layer dielectric) is disposed over the first gate and the second gate.

Thus, the present disclosure provides transistors having increased effective channel width relative to a planar channel width, without increasing the channel length, which enables higher Gm without increasing the likelihood of Random Telegraph Signal, short channel effects, and other deleterious characteristics. The transistors provided herein also enable higher Gm without increasing the pixel size.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of manufacturing a transistor of an image sensor, comprising:
    forming a recess to a first depth in a substrate material, the recess corresponding to a gate region and extending in a channel length direction and a channel width direction that is perpendicular to the channel length direction;
    forming a trench structure in the substrate material by enlarging the recess to using an isotropic process such that the trench structure extends to a second depth, wherein a width of the trench structure changes from the first depth in the substrate material into the second depth of the substrate material, wherein the trench structure has a polygonal cross section defined in a channel width plane with at least four sidewall portions of the substrate material;
    forming a photodiode in the substrate material adjacent to the trench structure;
    forming an isolation layer on the substrate material;
    forming a gate portion of the isolation layer on the substrate material such that the gate portion of the isolation layer extends into the trench structure; and
    forming a gate on the isolation layer such that the gate extends into the trench structure.

2. The method of claim 1, wherein forming the recess includes using an anisotropic process.

3. The method of claim 2, wherein the anisotropic process is a dry etching process, and the first depth is about 0.030 um to about 0.100 um.

4. The method of claim 2, wherein forming the recess includes using a mask to define the gate region.

5. The method of claim 1, wherein the isotropic process is a wet etching process, and the second depth is about 0.150 um to about 0.200 um.

6. The method of claim 5, wherein the wet etching process includes controlling an etching rate ratio in a channel depth direction and in the channel width direction.

7. The method of claim 1, further comprising:
    forming a spacer disposed around the gate; and
    forming a dielectric layer on the gate.

8. The method of claim 1, wherein the transistor is a first transistor, the method further comprising fabricating a second transistor by:
    forming a second recess to a third depth in the substrate material, the second recess corresponding to a second gate region and extending in the channel length direction and the channel width direction;
    forming a second trench structure in the substrate material by deepening the second recess to a fourth depth using the isotropic process;
    forming a second gate portion of the isolation layer on the substrate material such that the second gate portion of the isolation layer extends into the second trench structure; and
    forming a second gate on the isolation layer such that the second gate extends into the second trench structure.

9. The method of claim 8, wherein the trench structure forms part of a row select transistor, and the second trench structure forms part of source follower transistor.

10. The method of claim 8, wherein forming the recess is performed substantially contemporaneously with forming the second recess, forming the trench structure is performed substantially contemporaneously with forming the second trench structure, and forming the gate is performed substantially contemporaneously with forming the second gate.

11. The method of claim 1, wherein each sidewall portion of the at least four sidewall portions has a sidewall dimension measured in the channel width plane, and an effective channel width of the transistor is greater than or equal to a sum of the sidewall dimensions of each sidewall portion of the at least four sidewall portions.

12. The method of claim 11, wherein two sidewall portions of the at least four sidewall portions have a same first sidewall dimension, and wherein two other sidewall portions of the at least four sidewall portions have a same second sidewall dimension.

13. The method of claim 1, wherein a plurality of the at least four sidewall portions are diagonal relative to a back side or a front side of the substrate material in the channel width plane.

14. The method of claim 1, wherein the at least four sidewall portions include a bottom sidewall portion that is parallel to a back side or a front side of the substrate material.

15. The method of claim 1, wherein the transistor has an effective channel width measured in the channel width plane that is greater than a planar channel width of the transistor, wherein the planar channel width is measured along a back side or a front side of the substrate material in the channel width plane.

16. The method of claim 1, wherein the polygonal cross section has a diamond shape.

17. The method of claim 1, wherein the trench structure has a second polygonal cross section in the channel length direction.

18. The method of claim 1, wherein at least two sidewall portions of the at least four sidewall portions form an angle of between about 40 degrees to about 60 degrees relative to a back side or a front side of the substrate material.

19. The method of claim 1, further comprising forming an isolation implant in the substrate material between the trench structure and the photodiode in the substrate material.

* * * * *